United States Patent [19]

Magdo et al.

[11] 3,858,231

[45] Dec. 31, 1974

[54] DIELECTRICALLY ISOLATED SCHOTTKY BARRIER STRUCTURE AND METHOD OF FORMING THE SAME

[75] Inventors: Ingrid E. Magdo; Steven Magdo, both of Hopewell Junction, N.Y.

[73] Assignee: International Business Machines Corporation, Armonk, N.Y.

[22] Filed: Apr. 16, 1973

[21] Appl. No.: 351,399

[52] U.S. Cl. .......... 357/15, 357/40, 357/47, 357/49

[51] Int. Cl. .......... H01l 11/00, H01l 15/00

[58] Field of Search .......... 317/235, 31, 22.11, 22.1, 317/22

[56] References Cited

UNITED STATES PATENTS

| | | | |
|---|---|---|---|
| 3,322,581 | 5/1967 | Hendrickson et al. | 317/235 U |
| 3,558,366 | 1/1971 | Lepselter | 317/235 UA |
| 3,564,309 | 2/1971 | Hoeberechts | 317/235 U |
| 3,581,151 | 5/1971 | Boyle | 317/235 U |
| 3,585,469 | 6/1971 | Jager | 317/235 U |
| 3,621,344 | 11/1971 | Portnoy | 317/235 U |
| 3,622,842 | 11/1971 | Oberai | 317/235 R |
| 3,649,386 | 3/1972 | Murphy | 317/235 F |
| 3,742,315 | 6/1973 | Iizuka et al. | 317/234 R |

*Primary Examiner*—Andrew J. James
*Attorney, Agent, or Firm*—J. B. Kraft

[57] ABSTRACT

A planar integrated circuit structure having a dielectrically isolated Schottky Barrier contact.

The structure has pockets of silicon surrounded by isolating regions of silicon dioxide extending from a planar surface, the silicon dioxide regions and silicon pockets being substantially coplanar at said surface. A layer of dielectric material, such as silicon nitride or a composite of silicon nitride over silicon dioxide, covers the surface. There is at least one opening extending through the dielectric layer to a coincident silicon pocket; the opening has larger lateral dimensions than said pocket so as to expose the pocket and a portion of the silicon dioxide region surrounding the pocket. A metallic layer in this opening forms a Schottky Barrier contact with the exposed silicon.

6 Claims, 13 Drawing Figures

DIELECTRICALLY ISOLATED SCHOTTKY BARRIER STRUCTURE AND METHOD OF FORMING THE SAME

BACKGROUND OF INVENTION

This invention relates to integrated Schottky Barrier contact structures, and particularly to such integrated Schottky Barrier contact structures which are in integrated circuits utilizing dielectric isolation. The Schottky Barrier contact is a rectifying metal-semiconductor junction. Such Schottky Barrier contacts utilize the Schottky effect based upon the rectification characteristics exhibited by well known metal-semiconductor interfaces. Generally, the electrical characteristics of these contacts depend upon the work function of the metal as well as the electron affinity in the semiconductor material. The high frequency response of semiconductor contacts or diodes is well known and results because the conduction phenomena which occurs under forward bias is caused primarily by majority carriers falling from the semiconductor into the metal. Consequently, the frequency-limiting effect of minority carrier storage is minimized. This high frequency response makes the utilization of Schottky Barrier diodes in high frequency rectification power supplies, high speed logic in memory circuits, and other circuits such as microwave applications particularly desirable. However, such diodes have a very significant leakage current and a low breakdown voltage under reverse bias. Consequently, there has been a considerable effort in the integrated circuit art to improve such reverse characteristics. The soft breakdown of the conventional planar Schottky Barrier diodes formed in openings in dielectric insulating layers on semiconductor substrates has been found to be due to an "edge effect" occurring at the metal-semiconductor interface at the edges of the opening in the dielectric material. At such edges, high field concentrations give rise to excess leakage and low breakdown voltages. This " edge effect" is described in detail in the article "Silicon Schottky Barrier Diode With Near-Ideal I–V Characteristics," by M. P. Lepselter et al., *The Bell System Technical Journal*, February 1968, pp. 195–208. As this article indicates, guard ring structures have been proposed to relieve this "edge effect" and thereby improve the reverse current-voltage characteristics of the Schottky Barrier contact. Other approaches in dealing with this problem are discussed in the articles "Characteristics of Aluminum-Silicon Schottky Barrier Diodes," A. Y. C. Yu et al., *Solid State Electronics*, Volume 13, 1970, pp. 97–104, and "Planar Mesa Schottky Barrier Diodes," N. G. Anantha et al., *IBM Journal of Research and Development*, November 1971, pp. 442–445. A related approach to this problem of Schottky Barrier diodes is described in copending patent application, Ser. No. 305,636, filed Nov. 10, 1972, by Anantha et al., assigned to the assignee of the present application now Defensive Publication T911021, issued June 26, 1973.

In addition, with the current trend in the integrated circuit art towards dielectric isolation in place of the currently standard junction isolation, there is a need for Schottky Barrier diode structures which would be readily integratable into such dielectrically isolated integrated circuits.

SUMMARY OF THE PRESENT INVENTION

Accordingly, it is an object of the present invention to provide a Schottky Barrier contact structure integratable in an integrated circuit which has a relatively high reverse breakdown characteristic while yet retaining its high frequency response.

It is another object of the present invention to provide a Schottky Barrier contact structure integratable in an integrated circuit which has a relatively high reverse voltage breakdown characteristic because it is not subject to "edge effect" problems.

It is a further object of the present invention to provide a Schottky Barrier contact structure integratable in a dielectrically isolated integrated circuit structure which has a relatively high reverse voltage breakdown characteristic not subject to "edge effect" problems.

It is even another object of the present invention to provide a Schottky Barrier contact structure integratable in a dielectrically isolated integrated circuit structure which has consistent and reproducible barrier characteristics.

It is an even further object of the present invention to provide a Schottky Barrier contact structure integratable in a dielectrically isolated integrated circuit structure passivated with a dual layer composite surface insulation, which contact has consistent and reproducible barrier characteristics.

It is yet another object of the present invention to provide a method of fabricating a Schottky Barrier contact structure having the above-described characteristics.

The Schottky Barrier contact structure of the present invention is integratable into a planar integrated circuit characterized by dielectric isolation formed by isolating regions of oxidized silicon extending from the planar surface of the integrated circuit substrate into the substrate; these regions of oxidized silicon surround pockets of silicon and are coplanar with the silicon pockets at the planar surface.

The integrated Schottky Barrier contacts which usually function as diodes are formed at one or more of such silicon pockets. They are formed by discrete metal layers in contact with and completely covering their respective pockets. The integrated circuit structure has a layer of dielectric material formed on said planar surface. Where the Schottky Barrier contacts are formed, there are openings extending through the dielectric layer to a coincident silicon pocket which has a maximum conductivity-determining impurity $C_0$ of $10^{18}$ atoms/cm$^3$; such openings must have larger lateral dimensions than their respective pockets so as to completely expose the surface of the pockets and a portion of the oxidized silicon region surrounding the pocket. The discrete metallic layers in contact with the pocket to form the Schottky Barrier contact are defined by such openings.

As a result of the above-described structure, the area of the Schottky Barrier or rectifying contact is completely defined by the surrounding oxidized silicon regions. This is insured by the openings through the dielectric layer at the contacts which have lateral dimensions greater than the silicon pocket so as to expose a portion of the surrounding oxidized silicon region as well as the entire surface of the interface between the silicon pocket and the surrounding oxidized silicon region.

As a result of having rectifying contact defined by this interface, all of the "edge effect" problems, such as excess leakage current and low breakdown voltage, are substantially eliminated because the "edge" of the rectifying contact does not overlie an unbordered portion of the silicon substrate. In this connection, it should be understood that if the openings through the dielectric layer did not have larger dimensions than the coincident silicon pockets but rather had the same dimensions, the alignment between the opening and the oxidized silicon/silicon pocket interface would have to be near perfect. Any misalignment would result in the edge of the opening in the dielectric layer defining at least a portion of the contact edge rather than having the contact edge completely defined by the oxidized silicon/silicon pocket interface. This would produce the undesirable "edge effect" along this portion of the contact edge.

The expedient of the larger contact hole through the dielectric layer is even more effective and provides even greater advantages where the dielectric layer is a composite of two layers. A great many present day integrated circuit structures require dielectric surface layers which are composites of two layers. The two-layered structure is usually required for purposes of greater passivation, ease in defining small openings through the dielectric layer and for masking purposes in forming metallic interconnection in the integrated circuit, particularly where multilevel metallurgy is used. A conventional composite dielectric layer is one having a lower layer of silicon dioxide and an upper layer of silicon nitride.

With such a two layer composite dielectric, there is a marked tendency of undercutting during the etching of holes through such composites. The undercutting is of the lower layer, i.e., the lower layer has greater dimensions than the upper layer which forms a ledge over the opening in the lower layer. In Schottky Barrier contact of the present invention, any misalignment between the opening through the composite layer and the oxidized silicon/silicon pocket interface may very well result in a problem in addition to the "edge effect" problem. Where the metallization in the integrated circuit is to consist of more than one layer, which is quite often the case, there is a considerable danger that metal from the upper layer of metallurgy will be forced through the misaligned opening into the undercut portion. In such a case, if there remains some portion of the silicon pocket surface uncovered by the first layer which forms the Schottky contact, a parallel Schottky contact will be formed by the second layer whidh will completely alter all characteristics of the Schottky Barrier contact, both forward and reverse. Under such circumstances, the Schottky contacts will not have consistent and reproducible barrier characteristics.

However, in accordance with the present invention, where the opening through the composite layer is larger than the dimensions of the coincident silicon pocket, the bottom metallic layer will completely cover the surface of the silicon pocket, and metal from the upper layer will be completely blocked from contacting the silicon pocket and producing such inconsistent effects.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
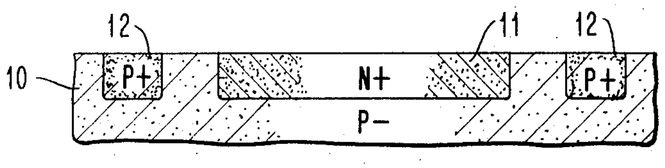
FIGS. 1–10 show diagrammatic sectional views of a portion of an integrated circuit in order to illustrate the method of fabricating the preferred embodiment of the present invention.

FIGS. 1–10 illustrate the preferred embodiment of the present invention. In a suitable wafer 10 of P-material, i.e., a silicon substrate having a resistivity of 10 ohm-cm, N+ region 11 is formed utilizing conventional photolithographic masking techniques involving a standard silicon dioxide masking of the surface of the substrate. The region may be formed by any conventional thermodiffusion of impurities, such as phosphorus, arsenic, antimony or the like, to an N+ surface concentration of $10^{21}$ atoms/cm$^3$. The diffusion may be made by any conventional open or closed thermal diffusion technique. By similar techniques, annular P+ region 12 is formed. The conductivity-determining impurity in region 12 may be a material such as boron or gallium having a $C_0$ of $5 \times 10^{19}$ atoms/cm$^3$. The structure at this stage is shown in FIG. 1. In this connection, it should be noted that the structure being shown and described is only a small portion of an integrated circuit and is intended to illustrate how a Schottky Barrier diode having a Schottky Barrier contact and an ohmic contact may be fabricated by techniques which are applicable to the overall integrated circuit.

Figure 2:
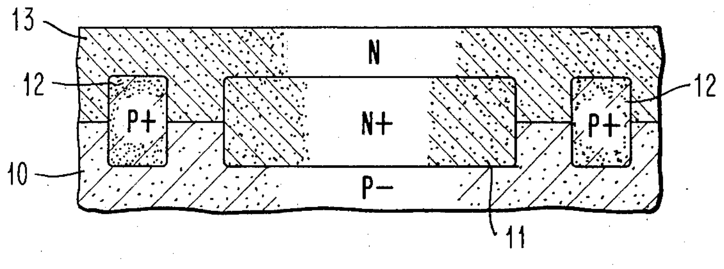

With reference to FIG. 2, there is then formed on substrate 10, an N epitaxial layer 13 having a maximum impurity concentration or doping level of $10^{18}$ atoms/cm$^3$ by conventional epitaxial techniques at a temperature in the order of from 950° to 1,150°C. over a period of 17 minutes. During the deposition of epitaxial layer 13, regions 11 and 12 outdiffuse partially up into this layer. The epitaxial layer has a thickness in the order of from 1 to 4 microns, depending on the overall specifications of the integrated circuit. For purposes of the present illustration, the thickness of the epitaxial layer is 2 microns. The epitaxial layer may be formed using the apparatus and method described in U.S. Pat. No. 3,424,629. Then, FIG. 3, a protective layer 14 of dielectric material is applied, using known techniques such as pyrolytic deposition or cathode sputtering. The protective layer is preferably silicon nitride or aluminum oxide. The silicon nitride can be formed by the pyrolytic technique of the reaction of silane and ammonium or other nitrogen-containing compound as described in the V. Y. Doo et al. patent application Ser. No. 142,013, filed May 10, 1971. A silicon nitride layer 14 is deposited at a temperature in the order of 1,000°C. and has a thickness in the order of 1,000A. It should be noted that instead of using a layer of silicon nitride alone, layer 14 may be a composite of silicon dioxide covered with silicon nitride. Such a composite may be desirable in reducing thermal stresses between the protective coating and underlying epitaxial layer 13. This composite may be easily formed by thermally oxidizing the surface of layer 13 to silicon dioxide having a thickness in the order of from 50 to 1,000A. prior to the previously mentioned deposition of the silicon nitride layer.

Figure 3:
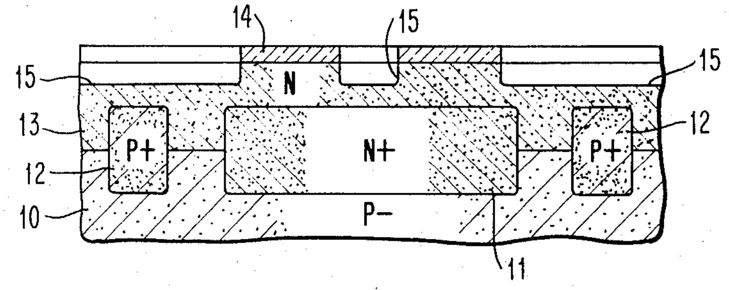
Figure 4:
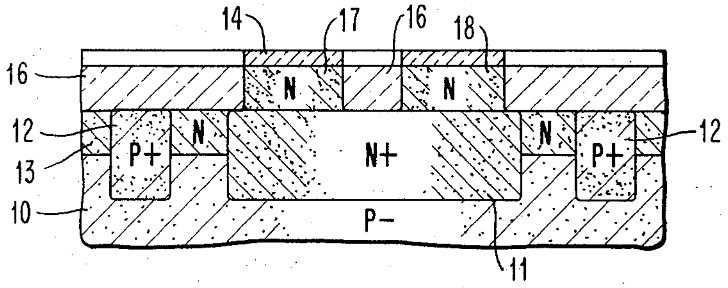

Next, as shown in FIG. 3, portions of protective layer 14 are etched away. A suitable etchant for silicon nitride is hot phosphoric acid or hot phosphoric salt. Where the previously described composite is used for layer 14, the underlying oxide layer may be removed by a suitable conventional etchant such as buffered HF. Next, as shown in FIG. 3, protective layer 14 is used as a mask and the epitaxial layer 13 is partially etched away in regions 15, using a suitable etchant for silicon, such as nitric acid, mercuric nitrate, and diluted hydrofluoric acid. This results in the mesa-like structure shown in FIG. 3. The structure is then put through an oxidation cycle wherein it is placed in an oxidation atmosphere at an elevated temperature, in the order of 970°C. to 1,100°C, with or without the addition of water, to produce silicon dioxide regions 16, as shown in FIG. 4, which extend substantially from the upper surface of epitaxial layer 13 to outdiffused regions 11 and 12. The oxidation is continued until regions 16 are substantially coplanar with the surface of remaining epitaxial layer 13. It should be noted that a portion of silicon epitaxial layer 13 is consumed in the oxidation process, thereby permitting silicon dioxide regions 16 to extend down to regions 11 and 12. Silicon dioxide regions 16 are formed so as to completely surround pockets 17 and 18 of epitaxial silicon. In order that the oxidation to form regions 16 be carried out so that the oxidation reaches underlying regions 11 and 12 at approximately the same time as the oxidation reaches the surface of epitaxial layer 13, etched recesses 15, FIG. 3, must be etched to a depth about half-way between the surface of epitaxial layer 13 and the points to which regions 11 and 12 have outdiffused.

Figure 5:
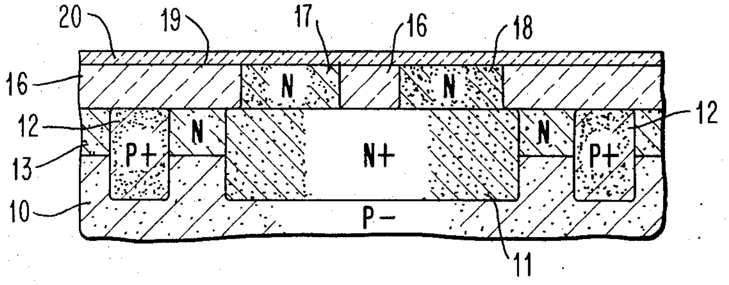
Figure 6:
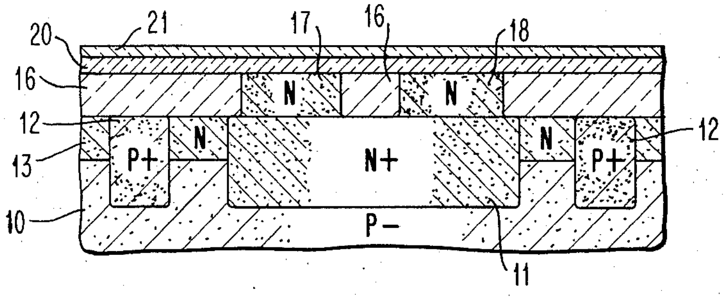

Then, a layer of dielectric material is formed completely covering the planar surface of layer 13. For purposes of illustration in the present embodiment, the layer of dielectric material over this planar surface of layer 13 will be a composite of a lower layer of silicon dioxide and an upper layer of silicon nitride. First, as shown in FIG. 5, a layer of silicon dioxide 20 is formed on surface 19. Before layer 20 is formed, the remainder of protective layer 14 must be removed. Where this is silicon nitride, it is removed using a conventional etchant for silicon nitride. Even in the case where protective layer 14 is also a composite of silicon nitride over silicon dioxide, only the silicon nitride need be removed; the silicon dioxide layer may be permitted to remain and form a part of silicon dioxide layer 20. Silicon dioxide layer 20 is preferably formed by thermally oxidizing the surfaces of the silicon pockets, e.g., pockets 17 and 18. When utilizing such a thermal oxidation approach, it is preferable when previously forming surrounding silicon dioxide regions 16 to oxidize these regions to a point that they extend beyond surface 19. Then, when surface 19 of the silicon pockets is oxidized, the resulting silicon dioxide formations may be controlled so as to be coextensive with such protrusions of regions 16, and thereby to provide a substantially level silicon dioxide layer 20. Silicon dioxide layer 20 has a thickness of 500A. – 2,000A. Next, silicon nitride layer 21 is deposited over layer 20 to a thickness of 1,600A. utilizing any conventional silicon nitride deposition technique as previously described.

Figure 7:
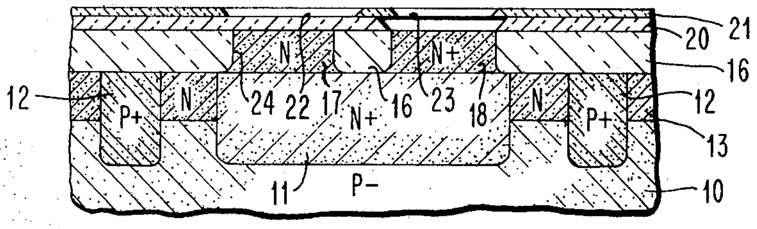
Figure 8:
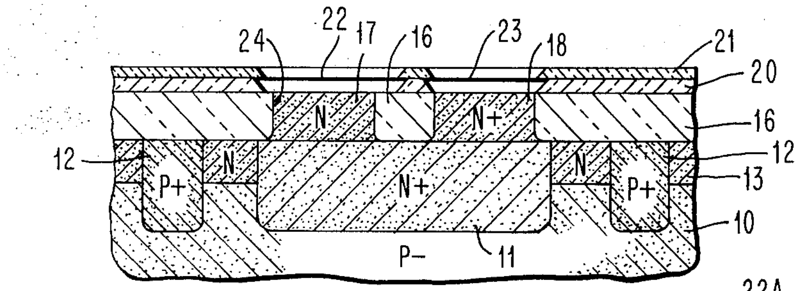

Next, commencing with FIG. 7, the formation of the ohmic and Schottky Barrier contacts will be described. An ohmic contact is to be made to silicon pocket 18 and a Schottky Barrier contact made to pocket 17. First, openings 22 and 23 respectively coincident with pockets 17 and 18 are made through nitride layer 21. These openings may be made by any suitable etchant for silicon nitride which does not rapidly attack the underlying silicon dioxide layer 20. A suitable etchant is hot phosphoric acid. Opening 22, which will define the Schottky Barrier contact opening, has larger lateral dimensions than pocket 17 so as to extend beyond the limits of interface 24 between pocket 17 and surrounding oxide 16. On the other hand, opening 23, which is to define the ohmic contact, need not be larger than its underlying pocket 18. Next, utilizing suitable photoresist techniques whereby opening 22 is masked, the portion of silicon dioxide layer 20 in opening 23 is removed by etching to extend hole 23 to the surface of pocket 18. A suitable etchant for this silicon dioxide is buffered hydrofluoric acid. Then, utilizing standard diffusion techniques, an N+ contact having a conductivity-determining impurity $C_0$ of $10^{21}$ atoms/cm$^3$ is formed in pocket 18 while pocket 17 retains the $C_0$ of the N epitaxial layer which has a maximum of $10^{18}$ atoms/cm$^3$ and is preferably $5 \times 10^{16}$. This results in the structure shown in FIG. 7. Then, as shown in FIG. 8, utilizing an etchant for the silicon dioxide, opening 22 is extended through silicon dioxide layer 20 to expose the surface of underlying pocket 17. It should be noted from FIG. 8 that when etching out the portion of silicon dioxide layer 20 in openings 22 and 23, layer 20 is undercut where it borders these openings. This results in silicon nitride layer 21 overhanging silicon dioxide layer 20 in these openings.

Such an overhang will not cause any problems with respect to the ohmic metallic contacts to be formed in opening 23. Neither will the ohmic contact to be formed in opening 23 be subject to any problems resulting from minor misalignments. Consequently, with respect to FIGS. 9 and 10 which show the completion of the preferred embodiment of the present invention, and FIGS. 11–13 which are directed to problems of misalignment solved by said embodiment, only that portion of the integrated circuit at which Schottky Barrier contact is formed is shown in enlarged detail. The metallization and dielectric layer structure at the ohmic contact will, of course, be similar to that shown for the Schottky contact.

Figure 9:
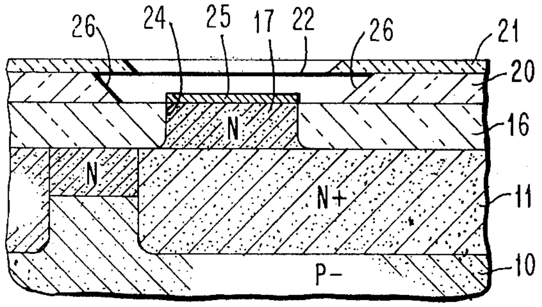

First, utilizing any conventional technique, such as sputtering or preferably vapor deposition, a thin layer of platinum in the order of 300A. – 500A. is deposited over the entire surface of the substrate as well as in openings, such as opening 22. The structure is then sintered in an inert atmosphere at a temperature of about 550°; C. for a period of 20 minutes. The sintering operation produces an alloying of the platinum in opening 22 with the exposed silicon of pocket 17 to form platinum silicide, while the remainder of the platinum remains unaffected. The remaining of unalloyed platinum is then removed by suitable means, such as selective etching, with an etchant, e.g., aqua regia, which will remove the platinum without affecting the platinum silicide formed on the surface of silicon pocket 17. The resulting structure is illustrated in FIG. 9 where platinum silicide layer 25 is shown over pocket 17. As is clearly shown in FIG. 9, hole 22 has been etched through silicon nitride layer 21 and silicon dioxide layer 22 with expanded lateral dimensions so that a portion of the surface of silicon dioxide region 16 surrounding interface 24 has been exposed. Consequently, when the platinum is deposited, it will also deposit on these exposed surfaces. However, after sintering, the platinum over the exposed surfaces of silicon dioxide region 16 will remain unaffected and will be removed by aqua regia, leaving platinum silicide layer 25 defined by interface 24. Platinum silicide layer 25 forms a Schottky Barrier contact with silicon pocket 17 which has a conductivity-determining impurity $C_0$ required for such contacts. The undercut in silicon dioxide layer 20 at edge 26 does not affect Schottky Barrier contact 25 because of the enlarged lateral dimensions of opening 22.

Figure 10:
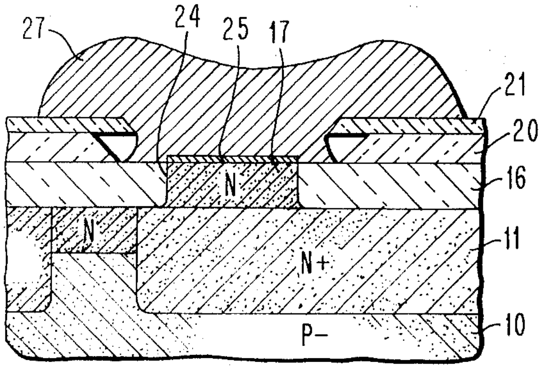

Next, as shown in FIG. 10, a layer of aluminum about 8,000A. to 10,000A. in thickness is deposited over the entire surface of the semiconductor structure, after which, by conventional selective photoresist etching, portions of the deposited aluminum layer are removed, leaving a portion 27 over platinum silicide layer 25. In this completed structure, the entire Schottky Barrier contact area is between the platinum silicide in layer 25 and the silicon in pocket 17. The area of the contact is fixed, being defined by interface 24.

Figure 11:
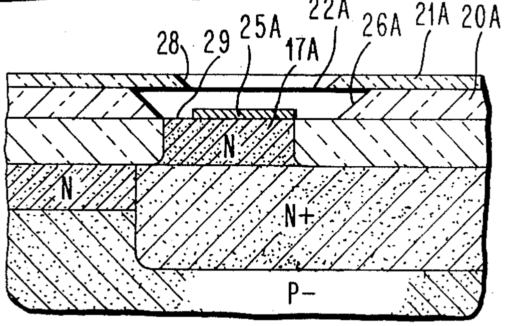
FIGS. 11 and 12 are diagrammatic sectional views of a portion of an integrated circuit in order to illustrate the problem where the preferred embodiment of the present invention is not practiced and there is a misalignment between an opening through the dielectric layer and an underlying silicon pocket.
Figure 12:
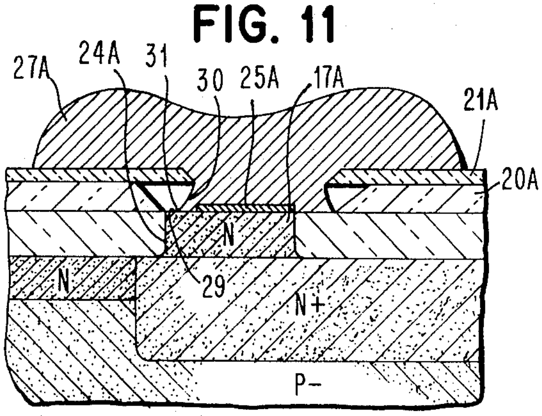
Figure 13:
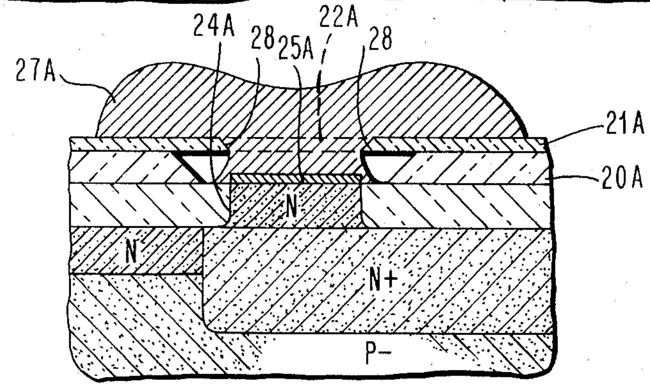
FIG. 13 is a diagrammatic sectional view of a portion of an integrated circuit illustrating a structure wherein the preferred embodiment of the present invention is not practiced; however, the openings through the dielectric layer and the underlying silicon pocket are substantially aligned.

In order to illustrate and emphasize the advantages using the enlarged opening in the preferred embodiment of the present invention, FIGS. 11–13 show the problems involved in utilizing an opening through a silicon nitride layer 21A which has the same lateral dimensions as underlying silicon pocket 17A. The primary problem is one of alignment between opening 22A and the silicon pocket. Where such alignment is substantially perfect, as shown in FIG. 13, the edge 28 of silicon nitride layer 21A will be substantially in registration with interface 24A. In this condition, edge 28 will define the deposition of platinum layer which is converted into the platinum silicide layer 25A completely in alignment with pocket 17A, as shown in FIG. 13, and there will be no "edge effect" problems and no problems arising out of parallel Schottky Barrier diode action.

On the other hand, if edge 28 is out of alignment with interface 24A, as shown in FIG. 11, all of the "edge effect" problems as well as those arising out of a parallel Schottky Barrier diode action, as previously described, are likely to occur. As openings become increasingly small, e.g., in the order of 0.1 mils across, the effects of even minimal misalignment become significant. Such misalignments tend to occur as a result of minor irregularities in the mask fabrication or in the mask alignment with respect to the substrate during device fabrication.

With the misalignment shown in FIG. 11, when the thin platinum layer is deposited, edge 28 will prevent any deposition over surface portion 29 of silicon pocket 17A. Accordingly, after the sintering and platinum removal step, surface portion 29 of pocket 17A will remain uncovered by platinum silicide layer 25A. Then, when, as shown in FIG. 12, aliminum layer 27A which is many times the thickness of layer 25A is deposited, the greater thickness of deposited layer 27A will result in a greater overlap beyond the limits of edge 28 and, thereby, result in a portion 30 of aluminum in contact with exposed silicon substrate 29. As a result, the structure in FIG. 12, will, in effect, have an uncalled-for second Schottky Barrier diode formed by aluminum portion 30 and silicon pocket 17A in parallel with the Schottky Barrier diode formed between platinum silicide layer 25A and silicon pocket 17A. In this case, the barrier characteristics of the Schottky Barrier contact formed by the combination of the platinum silicide diode and the aluminum diode will be markedly different than the characteristics of a contact formed by platinum silicide layer 25A alone, as shown in FIG. 13. Both the forward and reverse characteristics may be expected to be affected. Since the extent of misalignment may vary from contact to contact, it is very difficult to provide Schottky Barrier contacts of consistent characteristics when utilizing openings having the same lateral dimensions as pocket 17A. In addition, since the surface of pocket 17A in FIG. 12 still isn't completely covered by metal, the point 31, where edge of aluminum portion 30 contacts the surface of said pocket, should be subject to "edge effect" problems. The contact will be subject to excessive leakage current and low breakdown voltage.

While the preferred embodiment of the present invention has been described with respect to structures having composite dielectric surface layers of two materials, i.e., silicon dioxide and silicon nitride, the present invention has advantages in structures utilizing a single dielectric surface layer. With the latter structures, misalignment between the opening in the dielectric layer and the underlying silicon pocket will result in primarily "edge effect" problems. Therefore, in such structures, the present invention avoids such "edge effect" problems with the enlarged openings through the dielectric layer which insures that even if there is such misalignment, the entire surface of the silicon pocket will be covered by the metallic layer forming the Schottky contact.

While the advantages in the preferred embodiment have been set forth with respect to platinum silicide or platinum silicide overlaid with aluminum Schottky Barrier contacts, the structure of the present invention is applicable with any of the metals conventionally used for Schottky Barrier contacts. These include aluminum, copper-doped aluminum, palladium, chromium, molybdenum, nickel, and silver, among others.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A planar integrated circuit structure comprising:

a silicon substrate having isolating regions of oxidized silicon extending from a surface of said substrate into the substrate and surrounding pockets of silicon, said oxidized silicon regions and silicon pockets being substantially coplanar at said surface, a layer of dielectric material formed on said surface, at least one opening extending through said dielectric layer to a coincident silicon pocket having a maximum conductivity-determining impurity $C_0$ of $10^{18}$ atoms/$cm^3$, said opening having larger lateral dimensions than said pocket so as to expose the entire surface of said silicon pocket and a portion of the oxidized silicon region surrounding said pocket, and a metallic layer in said opening forming a Schottky Barrier contact with the entire surface of said exposed silicon pocket, said metallic layer also overlapping the exposed portion of the oxidized silicon region surrounding said pocket.

2. The planar integrated circuit structure of claim 1 wherein said layer of dielectric material is a composite of a bottom layer of silicon dioxide and a top layer of silicon nitride.

3. The planar integrated circuit structure of claim 2 wherein the second layer in the composite which is the upper layer is at least twice as thick as the first layer.

4. The planar integrated circuit structure of claim 1 wherein said metallic layer is a composite of first layer and second layers of different metals.

5. The planar integrated circuit structure of claim 1 wherein said silicon substrate is an epitaxial layer.

6. The structure of claim 1 further including at least one additional opening extending through said dielectric layer to a coincident silicon pocket, said additional opening having a maximum lateral dimension equal to that of its coincident silicon pocket, and a metallic layer in said additional opening forming an ohmic contact with the silicon pocket.

* * * * *